US007894205B2

(12) United States Patent
Lee et al.

(10) Patent No.: US 7,894,205 B2
(45) Date of Patent: Feb. 22, 2011

(54) VARIABLE DEVICE CIRCUIT AND METHOD FOR MANUFACTURING THE SAME

(75) Inventors: Sangseok Lee, Tokyo (JP); Yukihisa Yoshida, Tokyo (JP); Tamotsu Nishino, Tokyo (JP); Hiromoto Inoue, Tokyo (JP); Shinnosuke Soda, Tokyo (JP); Moriyasu Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 510 days.

(21) Appl. No.: 12/052,396

(22) Filed: Mar. 20, 2008

(65) Prior Publication Data

US 2008/0247115 A1    Oct. 9, 2008

(30) Foreign Application Priority Data

Apr. 5, 2007    (JP)    ............................. 2007-099104
Jan. 24, 2008    (JP)    ............................. 2008-013984

(51) Int. Cl.
*H05K 7/00*    (2006.01)
(52) U.S. Cl. ........................ 361/782; 361/793; 361/799; 361/277; 361/811; 361/268; 361/299.2; 361/301.1
(58) Field of Classification Search ................. 361/760, 361/793, 795, 799, 800, 803, 807, 811, 299.1–299.5, 361/298.2–298.5, 821, 268, 189, 190, 632, 361/643, 781–784, 301.1, 738, 763, 766, 361/277–278; 438/612–614; 29/852, 840, 29/847, 846, 830
See application file for complete search history.

(56) References Cited

U.S. PATENT DOCUMENTS 6,556,416 B2 * 4/2003 Kunihiro .................... 361/277
6,940,724 B2 * 9/2005 Divakar et al. .............. 361/719
7,768,792 B2 * 8/2010 Kim et al. ................... 361/760
2004/0214543 A1   10/2004 Osone et al.
2007/0133183 A1 * 6/2007 Urbach et al. ............... 361/760
2007/0145523 A1 * 6/2007 Chow et al. ................. 257/528
2010/0245012 A1 * 9/2010 Chang ........................ 336/200

FOREIGN PATENT DOCUMENTS

JP    2004-327877    11/2004

OTHER PUBLICATIONS

Dimitrios Peroulis, et al., "Electrostatically-Tunable Analog RF MEMS Varactors with Measured Capacitance Range of 300%", IEEE MTT-S Digest, International Microwave Symposium Digest, 2003, pp. 1793-1796.

* cited by examiner

*Primary Examiner*—Dameon E Levi
*Assistant Examiner*—Hoa C Nguyen
(74) *Attorney, Agent, or Firm*—Oblon, Spivak, McClelland, Maier & Neustadt, L.L.P.

(57) ABSTRACT

There is provided a variable device circuit according to the present invention, including: a substrate; at least one movable switch device formed on a first principal surface of the substrate; at least one fixed capacitor device formed on the first principal surface of the substrate; at least one variable capacitor device formed on the first principal surface of the substrate; at least one variable inductor device formed on the first principal surface of the substrate; and wiring lines for electrically connecting the devices to one another, the wiring lines being formed on the first principal surface of the substrate; wherein electrical connections among the devices can be selected by operation of the movable switch device, whereby achieving stable, low-loss circuit characteristics with lower manufacturing cost.

20 Claims, 6 Drawing Sheets

VARIABLE DEVICE CIRCUIT AND METHOD FOR MANUFACTURING THE SAME

BACKGROUND OF THE INVENTION

1. Field of the Invention

The present invention relates to variable device circuits and method for manufacturing the same, which can be formed by applying micromachining techniques or the like and which is suitable for radio-frequency variable components to be used in radio-frequency bands such as microwaves, semi-millimeter waves and millimeter waves.

2. Description of the Related Art

Recently, radio-frequency devices using micromachining techniques, so called RFMEMS (Radio Frequency Micro-Electro-Mechanical-Systems) devices, have been drawing attention. With this technique, high-aspect three-dimensional structures, hollow structures, variable structures and the like can be easily manufactured, thereby expectably allowing radio-frequency devices and circuits to be fabricated on low-priced silicon substrates with low cost, low loss, high isolation, and high-performance.

Also recently, RFMEMS radio-frequency variable circuits made up of RFMEMS active devices and RFMEMS passive devices, based on mechanical switches, have been in the spotlight as a key technology to next-generation radio-frequency modules that are required to operate on plural frequency bands. Further, RFMEMS radio-frequency variable circuits, when integrated in combination with existing CMOS high-frequency circuits, are expected to realize radio-frequency modules with higher functions, lower cost and lower size.

In addition, research and development of radio-frequency variable devices and circuits using micromachining techniques have been being advanced. For instance, Non-Patent Document 1 shown below, discloses a radio-frequency variable capacitor (hereinafter, referred to as first prior art) formed by using micromachining techniques.

The radio-frequency variable capacitor according to the first prior art is configured of a coplanar transmission line formed on a substrate, a bridge structure formed above a signal line of the coplanar transmission line, and a movable beam having an electrode connected from above the bridge through a pole.

Application of a driving voltage between the movable beam and the substrate causes the movable beam to be pulled toward the substrate by electrostatic force, so that the bridge which is connected thereto through the pole and provided on the coplanar transmission line is deformed. This deformation leads to a change in distance between the signal line of the coplanar transmission line and the bridge crossing thereover, which in turn results in a change in capacitance between the signal line of the coplanar transmission line and the bridge, hence, thereby acting as a variable capacitor. The change of the capacitance can be adjusted by the driving voltage applied to the movable beam.

Patent Document 1 shown below also discloses a radio-frequency variable device formed by using micromachining techniques (hereinafter, referred to as second prior art).

The radio-frequency variable device according to the second prior art is configured of a variable capacitor having a drive mechanism formed on the top face of the substrate using surface micromachining techniques, a fixed capacitor implemented by a pair of plural electrodes formed on the rear face of the substrate using bulk micromachining techniques, a switch formed on the top face of the substrate using surface micromachining techniques, and wiring lines for electrically connecting the switch, the variable circuit and the fixed capacitor to one another.

The fixed capacitor composed of a pair of plural electrodes is provided in plurality, and a fixed capacitor having a desired capacitance is selected by using the switch.

In the variable capacitor, a movable membrane and an upper electrode are provided above the wiring lines coupling to a lower electrode, in which application of a driving voltage between the lower electrode and the upper electrode causes the membrane to be deformed by electrostatic force, which in turn results in a change in distance between the upper electrode and the lower electrode so that the capacitance can change, thereby acting as a variable capacitor.

A fixed capacitor selected by the switch is electrically communicated with the variable capacitor, and the operating frequency of the device can be tuned stepwise by the selected fixed capacitor and moreover fine tuned by the variable capacitor.

The related prior arts are listed as follows: Japanese Patent Unexamined Publication (koukai) JP-2004-327877A, and a literature: D. Peroulis and P. B. Katehi, "Electrostatically-Tunable Analog RF MEMS Varactor with Measured Capacitance Range of 300%", 2003 IEEE MTT-S International Microwave Symposium Digest, pp. 1793-1796, 2003.

The radio-frequency variable capacitor according to the first prior art is configured of the bridge and the movable beam having the electrode above a coplanar transmission line, in which the bridge is connected to the movable beam via through the pole. In this case, a complicated drive mechanism is required, and the variable capacitor is not easy to manufacture.

Also, since the radio-frequency variable capacitor has insecure factors in terms of mechanical strength, there is a need for preparing a large-sized movable beam to give enough electrostatic force to the movable beam. This would lead to increases in size of the device or the like, entailing a problem that integration of switches, fixed capacitors, and variable inductors becomes difficult in manufacturing.

Further, although the relative variability ratio of capacitance is large, the area of the bridge as well as the distance between the bridge and the signal line of the coplanar transmission line are limited in terms of the device structure and its manufacture, so that the resultant capacitance is also limited. As a result, it is difficult to form the bridge and the movable beam above a thick-film coplanar transmission line because of a large step gap. This leads to an issue that conductor loss of the coplanar transmission line is hard to reduce.

On the other hand, in the case of the radio-frequency variable device according to the second prior art, the switch and the variable capacitor are fabricated on the top face of the substrate by using surface micromachining, and the fixed capacitor is fabricated on the rear face of the substrate by bulk micromachining. This would leads to a complexity in the fabrication process.

Also, because of increases in insertion loss due to through-wiring that connect the top face with the rear face of the substrate, a deep digging process of the substrate is indispensable in the fabrication process of the fixed capacitor. This makes a weak point of the radio-frequency variable capacitor in terms of its manufacturing cost.

Furthermore, in a comb-tooth structure making up the fixed capacitor, there is a high possibility of short circuits between electrodes due to metallization. It is also difficult to provide a lid structure, which is necessary to obtain stable electrical characteristics, on the rear face on which the fixed capacitor is formed. Still more, because of the structure that has difficulty in forming a dielectric film, there is a limitation of capacitance.

Moreover, for the variable capacitor, there is a high possibility of short circuits between the upper electrode (movable electrode) and the lower electrode due to a high step gap, giving rise to a problem in operational reliability of the fixed capacitor and the variable capacitor.

SUMMARY OF THE INVENTION

It is an object of the present invention to provide variable device circuits and method for manufacturing the same, which has stable, low-loss circuit characteristics with lower manufacturing cost by concurrent formation of variable devices and fixed passive devices, each having nearly the same device structure, on one surface of a substrate.

In order to achieve the above object, according to an aspect of the present invention, there is provided a variable device circuit including:

a substrate;

at least one movable switch device formed on a first principal surface of the substrate;

at least one fixed capacitor device formed on the first principal surface of the substrate;

at least one variable capacitor device formed on the first principal surface of the substrate;

at least one variable inductor device formed on the first principal surface of the substrate; and wiring lines for electrically connecting the devices to one another, the wiring lines being formed on the first principal surface of the substrate;

wherein electrical connections among the devices can be selected by operation of the movable switch device.

It is preferable that the fixed capacitor device includes a lower electrode on the substrate side, an upper electrode opposite to the lower electrode, a dielectric layer and an air layer, both of which are interposed between the lower electrode and the upper electrode, and the air layer is thicker than the dielectric layer.

It is preferable that the movable switch device, the variable capacitor device and the variable inductor device include a lower electrode on the substrate side, an upper electrode opposite to the lower electrode, and an air layer which is interposed between the lower electrode and the upper electrode, and a dielectric layer is formed on the lower electrode.

It is preferable that a lower electrode of each device is formed of a first metal layer having a higher resistance and a second metal layer having a lower resistance, and a bias line for driving the device is formed of the first metal layer and a dielectric layer covering the first metal layer.

It is preferable that the air layers, each interposed between the lower electrode and the upper electrode of each device, are substantially equal in thickness to one another.

It is preferable that a coplanar transmission line including a signal line and ground lines located on both sides of the signal line is provided on the first principal surface of the substrate, and at least one of the movable switch device, the fixed capacitor device, the variable capacitor device and the variable inductor device is inserted in the signal line.

It is preferable that a bias line for driving the device intersects the ground line with an interposed air layer.

It is preferable that a second ground line, which is provided for electrically connecting the ground lines located on both sides of the signal line to each other, intersects the signal line with an interposed air layer.

It is preferable that both the air layer interposed between the lower electrode and the upper electrode of each device and the air layer interposed between the bias line and the ground line have substantially the same thickness.

It is preferable that both the air layer interposed between the lower electrode and the upper electrode of each device and the air layer interposed between the second ground line and the signal line have substantially the same thickness.

According to another aspect of the present invention, there is also provided a method for manufacturing a variable device circuit, including steps of:

forming a first conductive layer with a predetermined pattern on a first principal surface of a substrate;

forming a dielectric layer with a predetermined pattern on the first principal surface of the substrate and the first conductive layer;

forming a sacrificial layer with a predetermined pattern, which is thicker than the dielectric layer, on the first principal surface of the substrate, the first conductive layer and the dielectric layer;

forming a second conductive layer with a predetermined pattern on the first principal surface of the substrate, the first conductive layer, the dielectric layer and the sacrificial layer; and forming an air layer between the first conductive layer and the second conductive layer by removing the sacrificial layer;

wherein at least two out of a movable switch device, a fixed capacitor device, a variable capacitor device and a variable inductor device are formed concurrently.

It is preferable that the first conductive layer includes a first metal layer having a higher resistance and a second metal layer having a lower resistance, and the method further including a step of forming a bias line for driving the device by removing the second metal layer of the first conductive layer which is formed in a predetermined pattern, followed by covering the first metal layer with a dielectric layer.

It is preferable that the first conductive layer constitutes a lower electrode for at least two devices formed concurrently, and the second conductive layer constitutes an upper electrode of at least two devices formed concurrently.

It is preferable that air layers interposed between the lower electrode and the upper electrode of at least two devices formed concurrently have substantially the same thickness.

It is preferable that the method further includes a step of forming a coplanar transmission line, which includes a signal line and ground lines located on both sides of the signal line, by using the first conductive layer and the second conductive layer.

It is preferable that at least two devices formed concurrently are inserted in the signal line.

It is preferable that the method further includes a step of forming the ground line so as to intersect a bias line for driving the device with an interposed air layer which is obtained by removal of the sacrificial layer.

It is preferable that the method further includes steps of:

forming a second ground line for electrically connecting the ground lines located on both sides of the signal line to each other; and forming the signal line so as to intersect second ground line with an interposed air layer which is obtained by removal of the sacrificial layer.

It is preferable that both the air layer interposed between the lower electrode and the upper electrode of each device and the air layer interposed between the bias line and the ground line have substantially the same thickness.

It is preferable that both the air layer interposed between the lower electrode and the upper electrode of each device and the air layer interposed between the second ground line and the signal line have substantially the same thickness.

According to an embodiment of the present invention, concurrent formation of a variable device and a fixed passive device, each having a nearly identical device structure, by using the same manufacturing processes, can realize a variable device circuit having more stable, lower-loss circuit characteristics with lower manufacturing cost, in comparison with cases in which a variable device and a fixed passive device, each having mutually different device structures, are formed independently of each other by using different manufacturing processes.

DETAILED DESCRIPTION OF THE PREFERRED EMBODIMENTS

Figure 1:
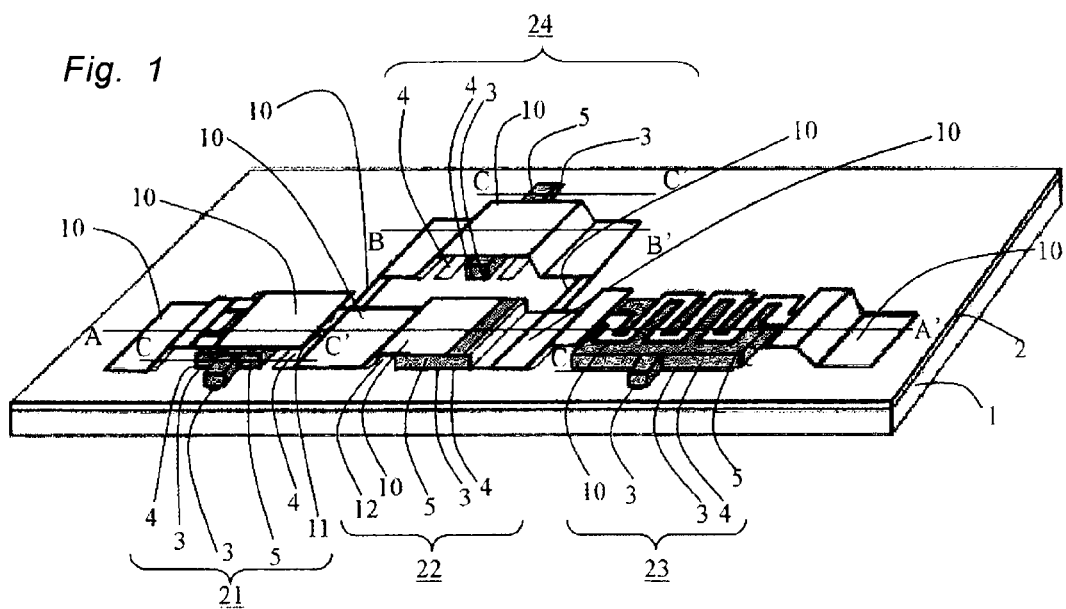
FIG. 1 is a perspective view showing an example of a variable device circuit according to Embodiment 1 of the present invention.

This application is based on an application No. 2007-99104 filed on Apr. 5, 2007 in Japan, the disclosure of which is incorporated herein by reference.

Hereinafter, preferred embodiments will be described with reference to drawings.

Hereinbelow, embodiments of the present invention will be described with reference to the accompanying drawings. Throughout the following description of respective embodiments, similar components are designated by the same reference numerals.

Embodiment 1

Figure 2:
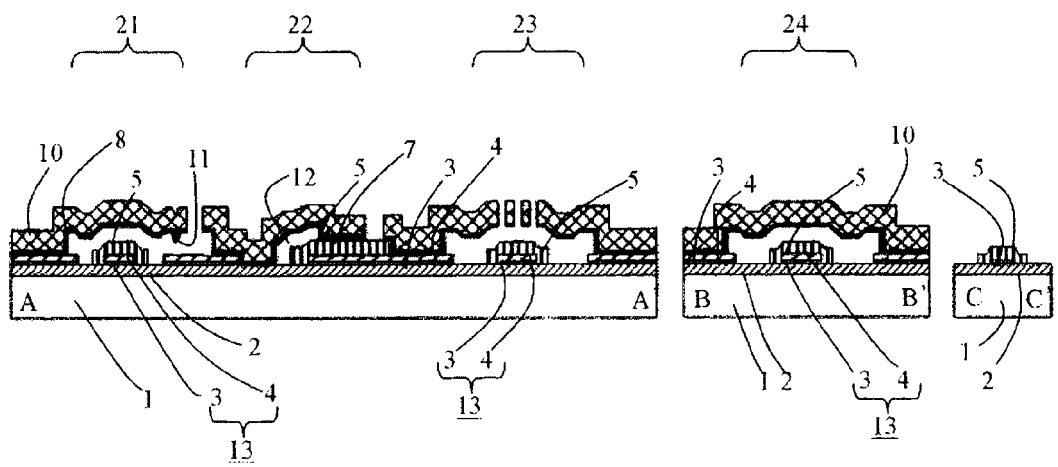
FIG. 2 shows longitudinal sectional views each taken along lines A-A', B-B' and C-C' in FIG. 1.

FIG. 1 is a perspective view showing an example of a variable device circuit according to Embodiment 1 of the invention. FIG. 2 shows longitudinal sectional views each taken along lines A-A', B-B' and C-C' in FIG. 1. Although a radio-frequency variable component is described below, the present invention is applicable to various types of high-frequency circuits and low-frequency circuits, for example, circuits in which variable devices and fixed passive devices are integrated on one and the same substrate, and circuits in which variable devices, fixed passive devices and common semiconductor active devices are integrated on one and the same substrate.

The radio-frequency variable component includes a movable switch device 21, a fixed capacitor device 22, a variable inductor device 23, and a variable capacitor device 24, all of which are formed on the top face of a substrate 1. For easier understanding, in this case, described is an example in which each device is mounted one by one on the substrate 1. However, plural devices of each type may be mounted on the substrate 1, and common semiconductor active devices, such as transistors and semiconductor integrated circuits, also may be mounted together therewith on the substrate 1.

The substrate 1 is formed of semiconductor material such as silicon and GsAs, or dielectric material such as glass, alumina and resin, or the like. On the top face of the substrate 1, an insulating film 2 made of oxide or other electric insulating material is formed throughout.

On the insulating film 2, a first conductive layer having a predetermined pattern is formed. In this case, exemplified is the first conductive layer formed of stacked layers of a first metal layer 3 and a second metal layer 4 on the substrate side. Alternatively, the first conductive layer may be formed of a single metal layer, or three or more metal layers.

The first conductive layer, as shown in FIG. 2, can function as a lower electrode 13 of the movable switch device 21, as a lower electrode 13 of the fixed capacitor device 22, as a lower electrode 13 of the variable inductor device 23, and as a lower electrode 13 of the variable capacitor device 24, and moreover as a wiring pattern for electrically connecting the respective devices.

A second conductive layer having a predetermined pattern is formed above the first conductive layer. In this case, exemplified is the second conductive layer formed of stacked layers of a seed metal layer 8 and a third metal layer 10 on the substrate side. Alternatively, the second conductive layer may be formed of a single metal layer, or three or more metal layers.

The second conductive layer, as shown in FIG. 2, can function as an upper electrode of the movable switch device 21, as an upper electrode of the fixed capacitor device 22, as an upper electrode of the variable inductor device 23, and as an upper electrode of the variable capacitor device 24, and moreover as a wiring pattern for electrically connecting the respective devices.

Next, construction and operation of each device is explained below.

In the movable switch device 21, an air layer is formed between the lower electrode 13 and the upper electrode, and a dielectric layer 5 is formed on the lower electrode 13. The upper electrode has a cantilever structure with one end being fixed to a particular wiring pattern and the other end being swingable, and a protrusive contact 11 is formed on the backside of the swingable tip end. Another wiring pattern is provided on the substrate 1 so as to face to the contact 11. A bias line for driving the device extends out from the lower electrode 13.

When a driving voltage is applied between the lower electrode 13 and the upper electrode through the bias line, the tip end of the upper electrode is flexurally deformed toward the substrate 1 by action of electrostatic force, so that the contact 11 makes contact with the opposed wiring pattern, resulting in a conducting state. In this situation, the dielectric layer 5 that covers the lower electrode 13 functions as an anti-stiction film between the lower electrode 13 and the upper electrode.

When application of the driving voltage is stopped, the contact 11 is returned away from the wiring by elastic force of the cantilever. In this way, opening and closing of the contact 11 can be controlled depending on whether the driving voltage is applied or not.

In the fixed capacitor device 22, the dielectric layer 5 is interposed between the lower electrode 13 and the upper electrode, and further an air layer 12 is interposed between electrodes so as to adjoin the dielectric layer 5. The capacitance of the fixed capacitor device 22 can be defined by an area of the electrode, an inter-electrode distance and a dielectric constant of the inter-electrode medium, and electric charge is stored in response to a voltage applied between the electrodes.

In the variable inductor device 23, an air layer is formed between the lower electrode 13 and the upper electrode, and a dielectric layer 5 is formed on the lower electrode 13. The upper electrode has a doubly clamped beam structure with both ends being fixed to particular wiring patterns and a central portion being swingable. A meander type or spiral-type of inductor is formed at the central portion. It is noted that a meander-type one is illustrated by way of an example in FIG. 1. A bias line for driving the device extends out from the lower electrode 13.

When a driving voltage is applied between the lower electrode 13 and the upper electrode through the bias line, the central portion of the upper electrode is flexurally deformed toward the substrate 1 by action of electrostatic force, so that the self inductance can be changed. In this situation, the dielectric layer 5 that covers the lower electrode 13 functions as an anti-stiction film between the lower electrode 13 and the upper electrode.

When application of the driving voltage is stopped, the upper electrode is restored to its original configuration by elastic force of the doubly clamped beam, where the self inductance returns to an initial value. In this way, the self inductance can be controlled depending on the magnitude of the driving voltage.

In the variable capacitor device 24, an air layer is formed between the lower electrode 13 and the upper electrode, and a dielectric layer 5 is formed on the lower electrode 13. The upper electrode has a doubly clamped beam structure with both ends being fixed to particular wiring patterns and a central portion being swingable. A bias line for driving the device extends out from the lower electrode 13.

When a driving voltage is applied to between the lower electrode 13 and the upper electrode through the bias line, the central portion of the upper electrode is flexurally deformed toward the substrate 1 by action of electrostatic force, so that the capacitance can be changed. In this situation, the dielectric layer 5 that covers the lower electrode 13 functions as an anti-stiction film between the lower electrode 13 and the upper electrode. When application of the driving voltage is stopped, the upper electrode is restored to its original configuration by elastic force of the doubly clamped beam, where the capacitance returns to an initial value. In this way, the capacitance can be controlled depending on the magnitude of the driving voltage.

Figure 3:
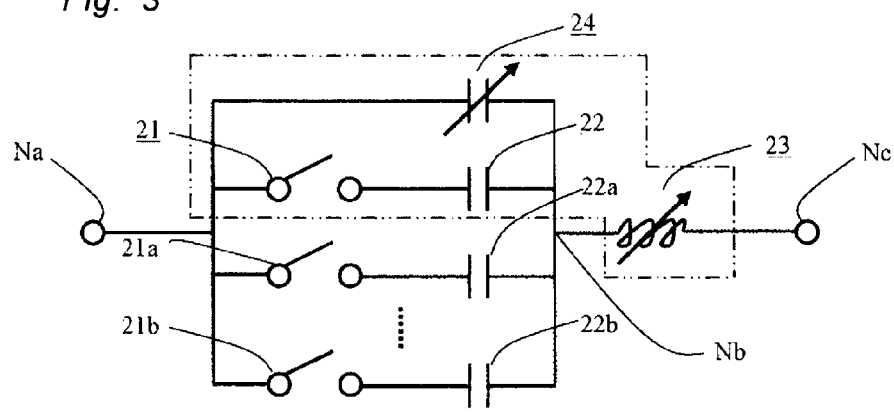
FIG. 3 is an equivalent circuit diagram of the radio-frequency variable component shown in FIG. 1.

FIG. 3 is an equivalent circuit diagram of the radio-frequency variable component shown in FIG. 1. A series circuit of the movable switch device 21 and the fixed capacitor device 22 is connected between a node Na and a node Nb, and the variable capacitor device 24 is connected in parallel to the series circuit. The variable inductor device 23 is connected between the node Nb and a node Nc. Also, although not shown in FIG. 1, a series circuit of a movable switch device 21a and a fixed capacitor device 22a as well as a series circuit of a movable switch device 21b and a fixed capacitor device 22b are connected between the node Na and the node Nb.

With regard to the operation, when the movable switch devices 21, 21a and 21b are turned off, a series circuit of the variable capacitor device 24 and the variable inductor device 23 is built up. The capacitance of the variable capacitor device 24 can be continuously controlled by the driving voltage of the bias line. The inductance of the variable inductor device 23 can be continuously controlled by the driving voltage of the other bias line. Accordingly, the resonance frequency of the series circuits can be continuously controlled.

Next, when the movable switch device 21 is turned on, the capacitance of the fixed capacitor device 22 is added so that the combined capacitance increases stepwise. Next, when the movable switch device 21a is turned on, the capacitance of the fixed capacitor device 22a is added so that the combined capacitance increases stepwise. Next, when the movable switch device 21b is turned on, the capacitance of the fixed capacitor device 22b is added so that the combined capacitance increases stepwise. Accordingly, the resonance frequency of the series circuits can be controlled stepwise by selective opening and closing of the movable switch devices 21, 21a and 21b. In general, with use of N movable switch devices, stepwise control of the resonance frequency is implementable in $2^N$ combinations.

Consequently, there can be realized a variable filter which can be tuned with high accuracy over a wide range of resonance frequency by stepwise control using a plurality of movable switch devices and by fine adjustment using variable capacitor devices and variable inductor devices.

In this case, a case in which a plurality of fixed capacitor devices are selected by selective operation of a plurality of movable switch devices has been shown by way of an example. Alternatively, selection of a plurality of fixed inductor devices, selection of variable capacitor devices and/or selection of a plurality of variable inductor devices can be implemented by selective operation of a plurality of movable switch devices.

Figure 4:
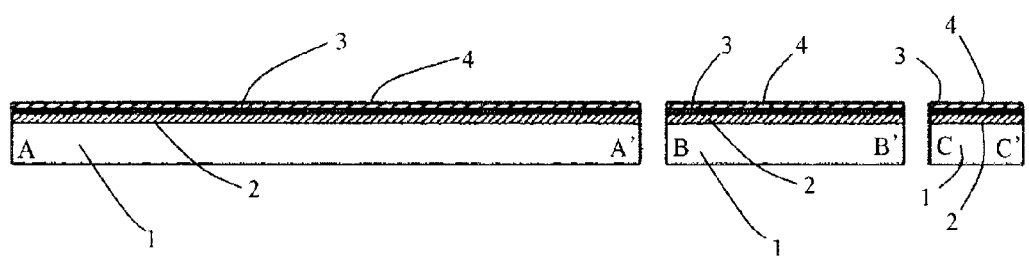
FIGS. 4 to 11 show longitudinal sectional views each taken along the lines A-A', B-B' and C-C' in FIG. 1, illustrating an example of a method for manufacturing radio-frequency variable components.

Now, a method for manufacturing the radio-frequency variable component shown in FIG. 1 is explained. First, as shown in FIG. 4, an electrically insulating material, e.g., about 1 µm thick oxide, is deposited on the top face of the substrate 1 by thermal oxidation process or the like to form an insulating film 2.

Next, for a first conductive layer on the insulating film 2, an electrically conductive material showing a relatively high resistance, such as titanium, is deposited by sputtering or the like to form a first metal layer 3. Subsequently, on the first metal layer 3, an electrically conductive material showing a relatively low resistance, such as gold, is deposited by sputtering or the like to form a second metal layer 4.

The first metal layer 3 is used to improve the degree of adhesion between the second metal layer 4 and the insulating film 2. Further, as described later, it is preferable that when the bias line is formed only of the first metal layer 3, an electrically conductive material and cross-sectional dimensions showing a relatively high resistance are adopted for the first metal layer 3 so that a high-resistance bias line can be obtained.

For the second metal layer 4, it is preferable to adopt such a material and cross-sectional dimensions that the degree of adhesion with the later-described seed layer 8 for the second conductive layer can be ensured.

Figure 5:
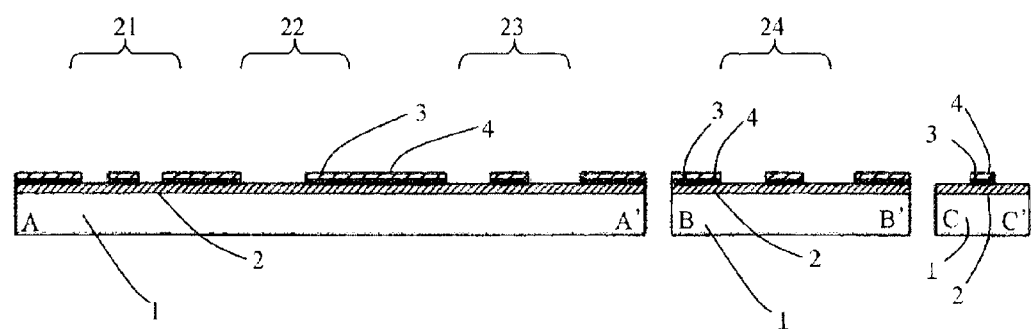

Next, as shown in FIG. 5, resist patterning and dry etching processes are carried out on the first metal layer 3 and the second metal layer 4 to form the lower electrode of the movable switch device 21, the lower electrode of the fixed capacitor device 22, the lower electrode of the variable inductor device 23, and the lower electrode of the variable capacitor device 24 as well as the wiring patterns for electrical connection of the respective devices.

Figure 6:
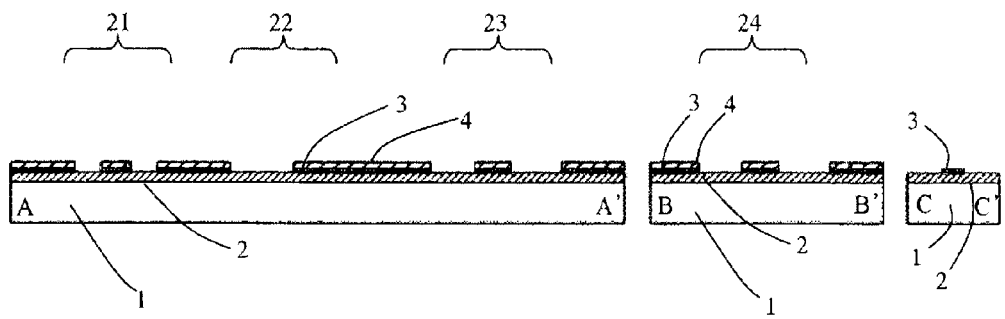

Next, as shown in FIG. 6, in order to form a high-resistance bias line, resist patterning and wet etching processes are carried out on the second metal layer 4 to partly remove the second metal layer 4, so that the bias line is formed only of the first metal layer 3.

Figure 7:
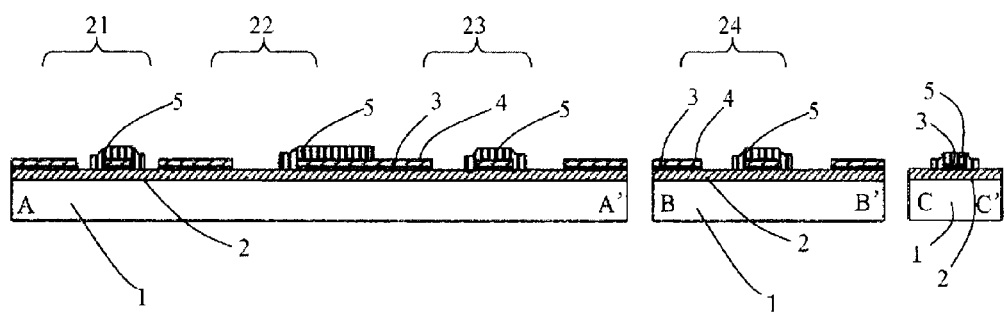

Next, as shown in FIG. 7, a dielectric material, e.g., about 1 μm thick nitride, is deposited on the first metal layer 3 or the second metal layer 4 by sputtering or the like. Thereafter, resist patterning and dry etching processes are carried out to form a dielectric layer 5 on the lower electrodes of the movable switch device 21, the fixed capacitor device 22, the variable inductor device 23 and the variable capacitor device 24 as well as on the bias line, respectively. In this case, the thicknesses of the dielectric layer 5 lying on the lower electrodes of the respective devices and the bias line may be different from one another.

Figure 8:
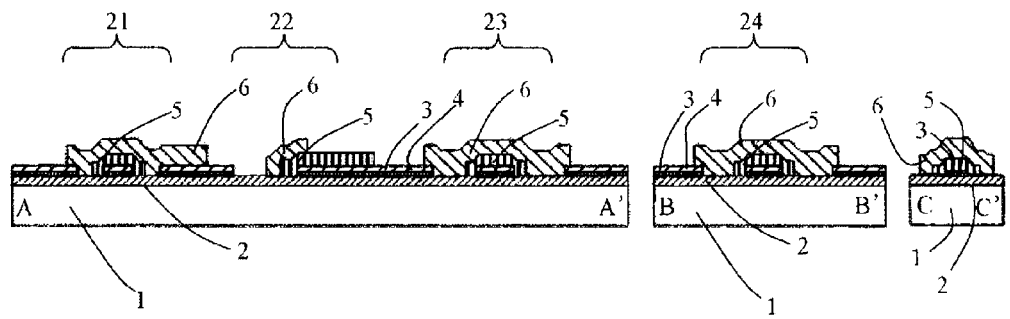

Next, as shown in FIG. 8, a metal material, e.g., about 1.5 μm thick nickel, is deposited by sputtering or the like. Thereafter, resist patterning and dry etching processes are carried out to form a sacrificial layer 6 on the lower electrodes of the movable switch device 21, the fixed capacitor device 22, the variable inductor device 23 and the variable capacitor device 24 as well as on the bias line, respectively, so as to correspond to the configuration and placement of the air layer of each device such as shown in FIG. 2.

In particular, in the movable switch device 21, the sacrificial layer 6 defines the configuration of the lower face of the upper electrode having a cantilever structure. In the fixed capacitor device 22, the sacrificial layer 6 is formed so as to extend from the top face of the substrate 1 beyond the lower electrode and reach part of the dielectric layer 5. In the variable inductor device 23 and the variable capacitor device 24, the sacrificial layer 6 defines the configuration of the lower face of the upper electrode having a doubly clamped beam structure.

Figure 9:
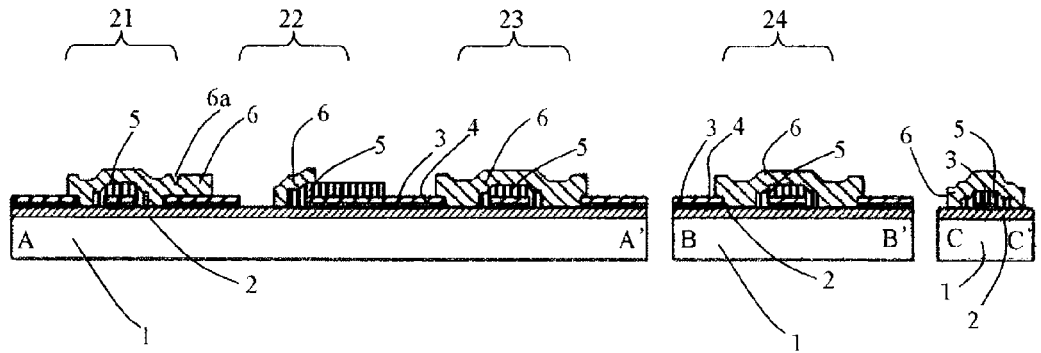

Next, as shown in FIG. 9, resist patterning and dry etching processes are carried out on the sacrificial layer 6 to form a dimpled shape 6a for shaping a contact 11 of the movable switch device 21.

Figure 10:
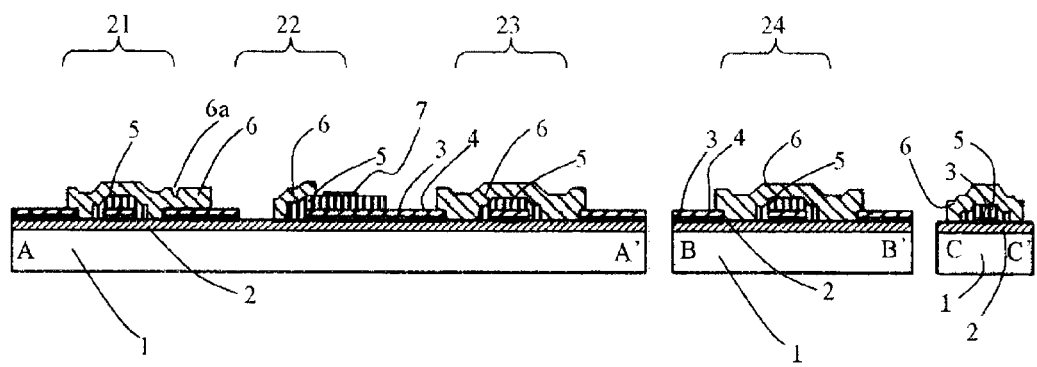

Next, as shown in FIG. 10, on the dielectric layer 5 of the fixed capacitor device 22, a conductor material, such as Cr (chromium), is deposited by sputtering or the like to improve the degree of adhesion between the dielectric layer 5 and the seed layer 8. Thereafter, resist patterning and wet etching processes are carried out to form an adhesion layer 7.

Figure 11:
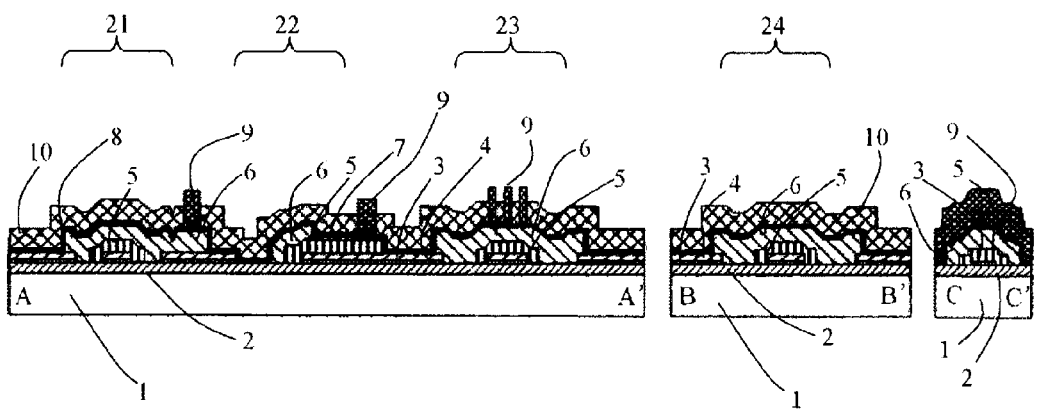

Next, as shown in FIG. 11, a conductor material, such as gold, is deposited by sputtering or the like to form a seed layer 8. The seed layer 8 is used for the succeeding step of thickening a third metal layer 10 using electroplating or the like.

Next, patterning of resist 9 is carried out on the seed layer 8, and thereafter a thick-film plated layer having a thickness of several microns is formed using, e.g., electroplating or the like, to form a third metal layer 10. The seed layer 8 and the third metal layer 10 constitute a second conductive layer acting as the upper electrode of each device.

Next, the resist 9 is removed and thereafter dry etching is carried out throughout the substrate 1 to remove the seed layer 8 under the resist 9. Subsequently, the sacrificial layer 6 is removed by wet etching to obtain a hollow-structured device having an air layer corresponding to the configuration of the sacrificial layer 6, as shown in FIG. 2.

Figure 12:
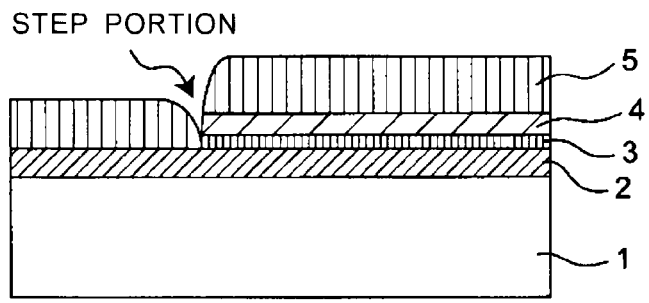
FIG. 12 is a sectional view showing film nonuniformity of the dielectric film at a step portion of the fixed capacitor.

In this embodiment, in the fixed capacitor device 22, not only the dielectric layer 5 but also the air layer 12 formed by removal of the sacrificial layer 6 are provided together between the lower electrode and the upper electrode. In the fixed capacitor device 22, in the case where the dielectric layer 5 is deposited by sputtering process or the like, since the material is deposited vertically on the substrate, the deposition rate at the step portion (directed parallel to the substrate) due to the thickness of the lower electrode is slower than that in the vertical direction with respect to the substrate, so that film nonuniformities of the dielectric layer 5 may occur as shown in FIG. 12, causing a possibility of electrical short circuits between the lower electrode and the upper electrode. As a countermeasure therefor, making the sacrificial layer 6 thicker than the dielectric layer 5 allows the air layer 12 to prevent such short circuits.

Further, additionally providing the air layer 12, which is of the lowest dielectric constant, in the fixed capacitor device 22 makes it possible to suppress a fringing effect between the lower electrode and the upper electrode. This produces an advantage that a capacitance as designed can be obtained.

Also, the dielectric layer 5 provided above the lower electrodes 13 of the movable switch device 21, the variable inductor device 23 and the variable capacitor device 24, respectively, functions as an anti-stiction film between the lower electrode 13 and the upper electrode.

Further, since the dielectric layer 5 is so formed as to cover the entire lower electrode of each device to prevent the lower electrode from being etched in the etching process of the seed layer 8 after the formation of the third metal layer, the fixed capacitor 22 and the variable capacitor 24 both of which are electrically stable and low in loss can be obtained.

Also in this embodiment, since the upper electrode of each device is thickened by the electroplating process using the seed layer 8, low-loss high frequency characteristics can be obtained by lowering the resistance of the upper electrode. This also further enhances the mechanical strength of the devices, thereby improving the device reliability.

Moreover, since the bias lines for driving the movable switch device 21, the variable inductor device 23 and the variable capacitor device 24 are formed of the first metal layer 3 made of an electrically conductive material, such as titanium, showing a relatively high resistance, hence, the bias lines can be higher in resistance.

Furthermore, in the manufacturing process of the radio-frequency variable component, forming the dielectric layer 5 and the sacrificial layer 6 also on the bias lines as shown in the C-C' sectional views of FIGS. 7 to 11 allows the bias lines to be securely prevented from being etched in the etching process of the dielectric layer 5 as well as in the etching process of the seed layer 8, hence, the bias lines can be higher in resistance by thinning the bias lines.

As a result, the higher resistance of the bias line can suppress leakage of high-frequency waves flowing through signal lines to the lower electrode 13 of each device, thereby preventing an increase in insertion loss of the high-frequency waves.

Also, the formation of the dimpled shape 6a for the contact 11 of the switch 21 is processed not simultaneously with the deposition of the sacrificial layer 6 but after the deposition and patterning of the sacrificial layer 6, hence, contaminants such as resist are less accumulated at the bottom of the dimpled shape 6a. Thus, a clean surface of the contact 11 of the switch 21 can be obtained, resulting in low-loss high frequency characteristics.

As described above, concurrent formation of the movable switch device 21, the fixed capacitor device 22, the variable inductor device 23 and the variable capacitor device 24, each having a nearly identical hollow structure, by using the same manufacturing processes, can realize a variable device circuit having more stable, lower-loss circuit characteristics with lower manufacturing cost.

Embodiment 2

Figure 13:
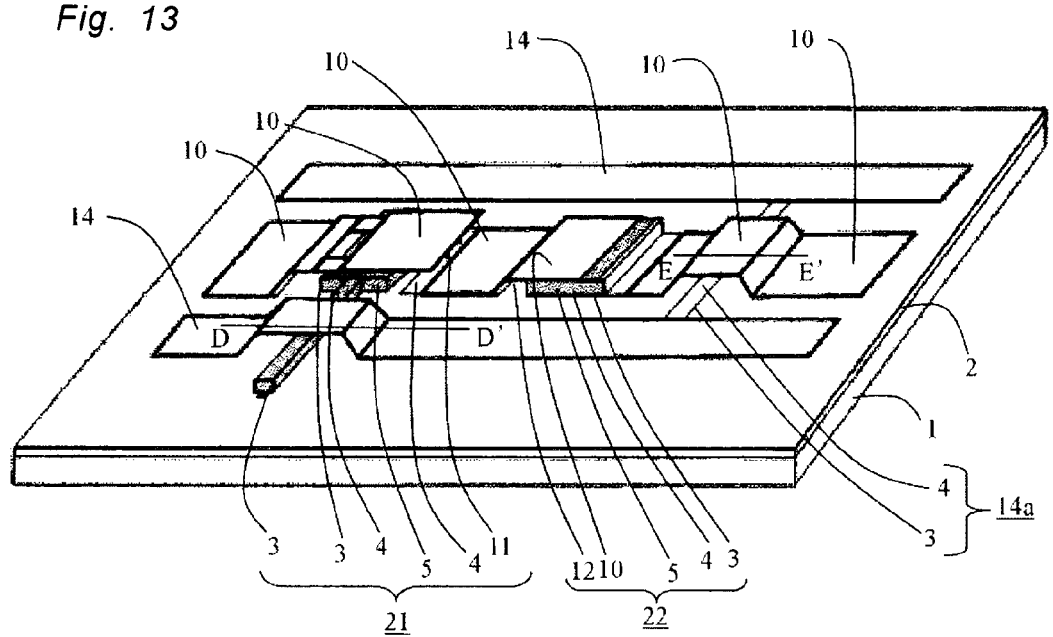
FIG. 13 is a perspective view showing an example of a variable device circuit according to Embodiment 2 of the invention.
Figure 14:
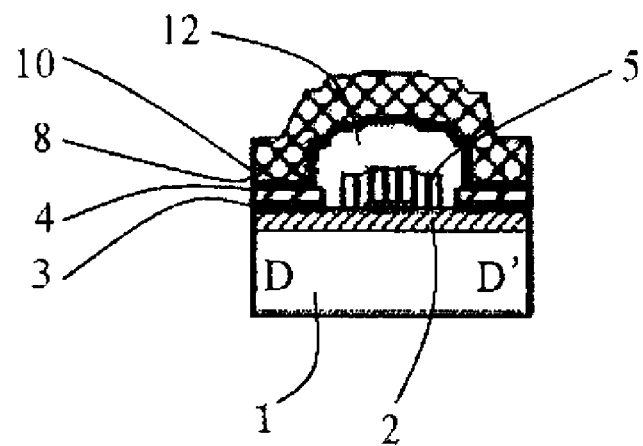
FIG. 14 is a longitudinal sectional view taken along the line D-D' in FIG. 13.
Figure 15:
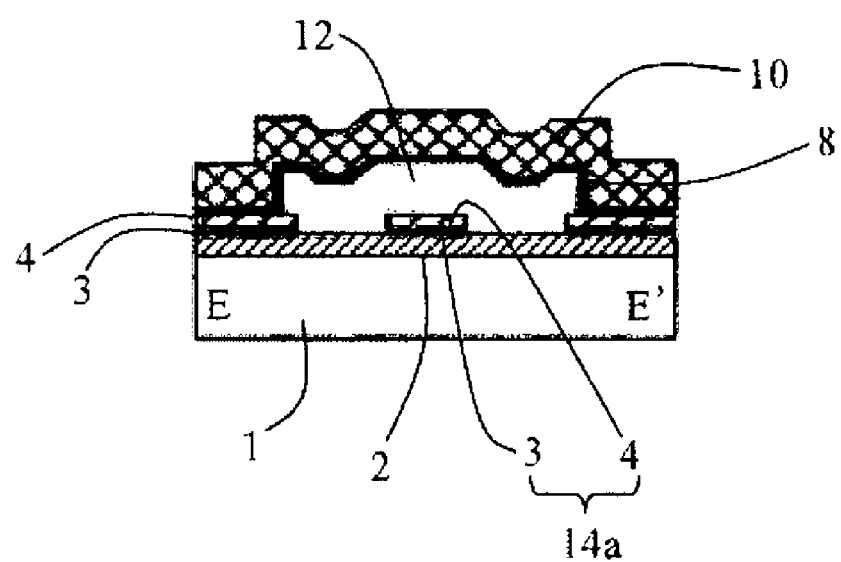
FIG. 15 is a longitudinal sectional view taken along the line E-E' in FIG. 13.

FIG. 13 is a perspective view showing an example of a variable device circuit according to Embodiment 2 of the invention. FIG. 14 is a longitudinal sectional view taken along the line D-D' in FIG. 13. FIG. 15 is a longitudinal sectional view taken along the line E-E' in FIG. 13. This embodiment will be described below by way of an example of such a radio-frequency variable component as in Embodiment 1.

For easier understanding, in this case, described is an example in which a series circuit of the movable switch device 21 and the fixed capacitor device 22 is formed on the top face of the substrate 1. However, the movable switch device 21, the fixed capacitor device 22, the variable inductor device 23, the variable capacitor device 24 and various active devices may be mounted each in a single or plural form on the substrate 1 as in Embodiment 1.

Also, since the movable switch device 21 and the fixed capacitor device 22 are similar in construction and operation to those of Embodiment 1, and so their duplicated description is omitted.

On the top face of the substrate 1, provided is a coplanar transmission line including a signal line in which a series circuit of the movable switch device 21 and the fixed capacitor device 22 is inserted, and ground lines 14 located on both sides of the signal line.

The signal line and the ground lines 14 can be concurrently formed with a desired pattern during the process of forming the first conductive layer (first metal layer 3, second metal layer 4, etc.) and/or the second conductive layer (seed layer 8, third metal layer 10, etc.) in the method for manufacturing the radio-frequency variable component as shown in FIGS. 4 to 11.

The bias line extending from the lower electrode of the movable switch device 21 is connected to a pad (not shown) by intersecting the ground line 14 with an interposed air layer. A dielectric layer 5 is formed on the bias line as shown in FIG. 7. Further, a sacrificial layer 6 is formed as shown in FIG. 8, thereafter a seed layer 8 is formed on the sacrificial layer 6 as shown in FIG. 11, and then a third metal layer 10 is formed by electroplating or the like so as to form a bridging portion of the ground lines 14. Subsequently, the sacrificial layer 6 is removed by wet etching, so that an air layer 12 can be formed below the bridging portion as shown in FIG. 14. The interposition of the air layer can securely prevent electrical short circuits between the bias line and the ground lines.

In this case, described above is an example in which the bias line is formed by patterning the first conductive layer and the bridging portion of the ground line 14 is formed by patterning the second conductive layer. Alternatively, the ground line 14 may be formed by patterning the first conductive layer and a bridging portion of the bias line may be formed by patterning the second conductive layer.

Further, a second ground line 14a is provided for electrically connecting the ground lines 14 on both sides of the signal line to each other.

The second ground line 14a can be concurrently formed simultaneously with a desired pattern during the process of forming the first conductive layer (first metal layer 3, second metal layer 4, etc.) and/or the second conductive layer (seed layer 8, third metal layer 10, etc.) in the method for manufacturing the radio-frequency variable component as shown in FIGS. 4 to 11.

The second ground line 14a intersects the signal line with an interposed air layer. A sacrificial layer 6 is formed on the second ground line 14a as shown in FIG. 8, thereafter a seed layer 8 is formed on the sacrificial layer 6 as shown in FIG. 11, and then a third metal layer 10 is formed by electroplating or the like so as to form a bridging portion of the signal line. Subsequently, the sacrificial layer 6 is removed by wet etching, so that an air layer 12 can be formed below the bridging portion as shown in FIG. 15. The interposition of the air layer can securely prevent electrical short circuits between the second ground line 14a and the signal line.

In this case, described above is an example in which the second ground line 14a is formed by patterning the first conductive layer and the bridging portion of the signal line is formed by patterning the second conductive layer. Alternatively, the signal line may be formed by patterning the first conductive layer and a bridging portion of the second ground line 14a may be formed by patterning the second conductive layer.

Further, described above is an example in which the second ground line 14a is formed below the bridging portion of the signal line. Alternatively, the second ground line 14a may also be fabricated so as to run below the variable capacitor device 24.

In this case, the air layer 12 interposed between the lower electrode and the upper electrode of such passive devices as the movable switch device 21 and the fixed capacitor device 22, the air layer 12 interposed between the bias line and the ground lines, and the air layer 12 interposed between the second ground line and the signal line are formed by removal of the sacrificial layer 6. Although the sacrificial layer 6 may be varied in thickness depending on where the sacrificial layer 6 is left, yet forming the respective sacrificial layers 6 to the same thickness can eliminate constraints on the patterning accuracy of the sacrificial layer 6, so that the respective components can be fabricated in a distance closer to one another, thereby enhancing the integration density. Further, the air layers corresponding to those sacrificial layers 6 are substantially equal in thickness to one another, so that stable electrical characteristics can be achieved.

In the description given above, described is an example in which the movable switch device 21, the fixed capacitor device 22, the variable inductor device 23, and the variable capacitor device 24 are formed on one side of the substrate 1. In addition to this, the fixed inductor device may also be formed together.

Also, described above is an example in which a meander-type of inductor is used for the variable inductor device 23. However, without limiting to this, a spiral-type of inductor may be used in the present invention.

Also, described above is an example in which a bridge-type of movable portion is used for the variable capacitor device 24. However, without limiting to this, a cantilever-type of movable portion may be used in the present invention.

Also, described above is an example in which a cantilever-type of metal-contact switch is used for the movable switch device 21. However, without limiting to this, other mechanical-type of switch having a mechanical drive mechanism may be used in the present invention.

Also, described above is an example in which titanium is used for the first metal layer 3, and an electrically conductive material made of gold is used for the second metal layer 4, the seed layer 8 and the third metal layer 10. However, without limiting to this, other metal materials, such as silver or copper, may be used to form a conductor with a predetermined configuration by carrying out patterning and etching processes based on photolithography techniques in the present invention.

Also, described above is an example in which a dielectric material made of nitride is used for the dielectric layer 5. However, without limiting to this, another dielectric material, such as oxide, may be used to form a dielectric with a predetermined configuration by carrying out patterning and etching processes based on photolithography techniques in the present invention.

Also, described above is an example in which nickel is used for the sacrificial layer 6. However, without limiting to this, any other materials may be used to form a sacrificial layer with a predetermined configuration by carrying out patterning and etching processes based on photolithography techniques, as long as it can be removed using etching at the final step.

Also, described above is an example in which a silicon substrate is used for the substrate 1. However, without limiting to this, dielectric substrate, such as glass substrate, alumina substrate, resin substrate, or semiconductor substrate, such as GaAs substrate, may be used in the present invention.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A variable device circuit comprising:
   a substrate;
   at least one movable switch device formed on a first principal surface of the substrate;
   at least one fixed capacitor device formed on the first principal surface of the substrate;
   at least one variable capacitor device formed on the first principal surface of the substrate;
   at least one variable inductor device formed on the first principal surface of the substrate; and
   wiring lines for electrically connecting the devices to one another, the wiring lines being formed on the first principal surface of the substrate;
   wherein electrical connections among the devices can be selected by operation of the movable switch device.

2. The variable device circuit according to claim 1, wherein the fixed capacitor device includes a lower electrode on the substrate side, an upper electrode opposite to the lower electrode, a dielectric layer and an air layer, both of which are interposed between the lower electrode and the upper electrode, and
   the air layer is thicker than the dielectric layer.

3. The variable device circuit according to claim 1, wherein the movable switch device, the variable capacitor device and the variable inductor device include a lower electrode on the substrate side, an upper electrode opposite to the lower electrode, and an air layer which is interposed between the lower electrode and the upper electrode, and
   a dielectric layer is formed on the lower electrode.

4. The variable device circuit according to claim 1, wherein a lower electrode of each device is formed of a first metal layer having a higher resistance and a second metal layer having a lower resistance, and
   a bias line for driving the device is formed of the first metal layer and a dielectric layer covering the first metal layer.

5. The variable device circuit according to claim 1, wherein air layers, each interposed between a lower electrode and an upper electrode of each device, are substantially equal in thickness to one another.

6. The variable device circuit according to claim 1, wherein a coplanar transmission line including a signal line and ground lines located on both sides of the signal line is provided on the first principal surface of the substrate, and
   at least one of the movable switch device, the fixed capacitor device, the variable capacitor device and the variable inductor device is inserted in the signal line.

7. The variable device circuit according to claim 6, wherein a bias line for driving the device intersects the ground line with an interposed air layer.

8. The variable device circuit according to claim 6, wherein a second ground line, which is provided for electrically connecting the ground lines located on both sides of the signal line to each other, intersects the signal line with an interposed air layer.

9. The variable device circuit according to claim 7, wherein both an air layer interposed between a lower electrode and an upper electrode of each device and the air layer interposed between the bias line and the ground line have substantially the same thickness.

10. The variable device circuit according to claim 8, wherein both an air layer interposed between a lower electrode and an upper electrode of each device and the air layer interposed between the second ground line and the signal line have substantially the same thickness.

11. A method for manufacturing a variable device circuit, including steps of:
    forming a first conductive layer with a predetermined pattern on a first principal surface of a substrate;
    forming a dielectric layer with a predetermined pattern on the first principal surface of the substrate and the first conductive layer;
    forming a sacrificial layer with a predetermined pattern, which is thicker than the dielectric layer, on the first principal surface of the substrate, the first conductive layer and the dielectric layer;
    forming a second conductive layer with a predetermined pattern on the first principal surface of the substrate, the first conductive layer, the dielectric layer and the sacrificial layer; and
    forming an air layer between the first conductive layer and the second conductive layer by removing the sacrificial layer;
    wherein at least two out of a movable switch device, a fixed capacitor device, a variable capacitor device and a variable inductor device are formed concurrently.

12. The method according to claim 11, wherein the first conductive layer includes a first metal layer having a higher resistance and a second metal layer having a lower resistance, and
    the method further including a step of forming a bias line for driving the device by removing the second metal layer of the first conductive layer which is formed in a predetermined pattern, followed by covering the first metal layer with a dielectric layer.

13. The method according to claim 11, wherein the first conductive layer constitutes a lower electrode for at least two devices formed concurrently, and the second conductive layer constitutes an upper electrode of at least two devices formed concurrently.

14. The method according to claim 13, wherein air layers interposed between the lower electrode and the upper electrode of at least two devices formed concurrently have substantially the same thickness.

15. The method according to claim 11, further including a step of forming a coplanar transmission line, which includes a signal line and ground lines located on both sides of the signal line, by using the first conductive layer and the second conductive layer.

16. The method according to claim 15, wherein at least two devices formed concurrently are inserted in the signal line.

17. The method according to claim 15, further including a step of forming the ground line so as to intersect a bias line for driving the device with an interposed air layer which is obtained by removal of the sacrificial layer.

18. The method according to claim 15, further including steps of:

forming a second ground line for electrically connecting the ground lines located on both sides of the signal line to each other; and forming the signal line so as to intersect second ground line with an interposed air layer which is obtained by removal of the sacrificial layer.

19. The method according to claim 17, wherein both an air layer interposed between a lower electrode and an upper electrode of each device and the air layer interposed between the bias line and the ground line have substantially the same thickness.

20. The method according to claim 18, wherein both an air layer interposed between a lower electrode and an upper electrode of each device and the air layer interposed between the second ground line and the signal line have substantially the same thickness.

* * * * *